US012771077B2

(12) United States Patent
Wang

(10) Patent No.: US 12,771,077 B2
(45) Date of Patent: Oct. 20, 2026

(54) SHIELDING DEVICE AND ELECTRONIC DEVICE

(71) Applicant: Getac Technology Corporation, New Taipei City (TW)

(72) Inventor: Pei-Lun Wang, Taipei City (TW)

(73) Assignee: Getac Technology Corporation, New Taipei City (TW)

( * ) Notice: Subject to any disclaimer, the term of this patent is extended or adjusted under 35 U.S.C. 154(b) by 309 days.

(21) Appl. No.: 18/775,183

(22) Filed: Jul. 17, 2024

(65) Prior Publication Data

US 2025/0149833 A1 May 8, 2025

(30) Foreign Application Priority Data

Nov. 7, 2023 (CN) ......................... 202311469803.7

(51) Int. Cl.
*H01R 13/6582* (2011.01)
*H01R 13/6594* (2011.01)
*H10B 80/00* (2023.01)

(52) U.S. Cl.
CPC ..... *H01R 13/6582* (2013.01); *H01R 13/6594* (2013.01); *H10B 80/00* (2023.02)

(58) Field of Classification Search
None
See application file for complete search history.

(56) References Cited

U.S. PATENT DOCUMENTS

| | | | | |
|---|---|---|---|---|
| 5,614,694 A | 3/1997 | Gorenz, Jr. et al. | | |
| 5,737,194 A * | 4/1998 | Hopkins | H05K 7/1461 361/728 | |
| 7,208,675 B2 | 4/2007 | Horng | | |
| 9,312,619 B2 | 4/2016 | Tseng et al. | | |
| 10,028,374 B2 * | 7/2018 | Xu | H05K 1/0216 | |
| 10,297,998 B2 * | 5/2019 | Tsuchida | H01F 27/022 | |
| 2018/0310441 A1 | 10/2018 | Chang et al. | | |

FOREIGN PATENT DOCUMENTS

| | | |
|---|---|---|
| CN | 207995647 U | 10/2018 |
| CN | 218634669 U | 3/2023 |
| EP | 0726700 B1 | 8/1996 |
| TW | M327157 U | 2/2008 |
| TW | 200833236 A | 8/2008 |
| TW | M559046 U | 4/2018 |
| TW | I646547 B | 1/2019 |
| TW | M598580 U | 7/2020 |

* cited by examiner

*Primary Examiner* — Tho D Ta
(74) *Attorney, Agent, or Firm* — COOPER LEGAL GROUP LLC

(57) ABSTRACT

A shielding device is suitable for applying in an electronic module arranged on a mainboard of an electronic device having a housing baseboard. The mainboard is provided with a connector. The shielding device includes a fixing frame and a shielding cover. The fixing frame is provided with an accommodating space suitable for accommodating the connector and the electronic module. The fixing frame includes two first side walls, two second side walls, and a press plate connecting to one of the two first side walls and covering the connector. A part of the press plate is covered by the housing baseboard. The shielding cover is pivotally connected to one side, away from the press plate, of the fixing frame and may be opened or closed relative to the fixing frame. The electronic module is exposed through opening of the shielding cover and is shielded through closing of the shielding cover.

12 Claims, 5 Drawing Sheets

SHIELDING DEVICE AND ELECTRONIC DEVICE

CROSS-REFERENCE TO RELATED PATENT APPLICATION

This non-provisional application claims the benefit of priority to China Patent Application No. 202311469803.7, filed on Nov. 7, 2023, in the People's Republic of China. The entire content of the above identified application is incorporated herein by reference.

FIELD OF THE INVENTION

The present invention relates to a shielding device, and more particularly to a shielding device convenient for disassembling an electronic module, and an electronic device.

BACKGROUND OF THE INVENTION

The double date rate synchronous dynamic random access memory (DDR-SDRAM) is a next-generation product following the single date rate synchronous dynamic random access memory (SDR-SDRAM). With the increasing usage requirements of people and technological innovation, the fifth-generation DDR-SDRAM (DDR5) may bring about higher channel efficiency, improved power consumption management, and optimized performance to cope with more efficient computing systems. However, because DDR5 itself generates more noisy signals, a shielding cover needs to be arranged to cover the DDR5, to prevent the noisy signals generated by the DDR5 during operation from interfering with signal transmission of other electronic components.

SUMMARY OF THE INVENTION

The present invention provides a shielding device. A user may replace an electronic module only by opening a shielding cover without dismantling a housing baseboard of an electronic device; and the user forgetting to close the shielding cover after replacing the electronic module by himself and affecting the shielding effect may be better avoided.

The shielding device provided by the present invention is suitable for applying in an electronic module arranged on a mainboard of an electronic device having a housing baseboard. The mainboard is provided with a connector suitable to be electrically connected to the electronic module. The shielding device includes a fixing frame and a shielding cover. The fixing frame is fixedly arranged on the mainboard and provided in a framing manner with an accommodating space suitable for accommodating the connector and the electronic module. The fixing frame includes two first side walls opposite to each other, two second side walls opposite to each other, and a press plate. The press plate is connected to one of the two first side walls and covers the connector. A part of the press plate is covered by the housing baseboard of the electronic device. The shielding cover is pivotally connected to one side, away from the press plate, of the fixing frame and is suitable to be opened or closed relative to the fixing frame, where opening of the shielding cover is suitable to expose the electronic module, and closing of the shielding cover is suitable to shield the electronic module.

In an embodiment of the present invention, a second one of the two first side walls not connected to the press plate has a first surface, each of the two second side walls has a second surface, and when the shielding cover is closed relative to the fixing frame, the first surface and the second surface are covered by the shielding cover.

In an embodiment of the present invention, the shielding cover has a front edge and a back edge opposite to each other, and two side edges opposite to each other, and when the shielding cover is closed relative to the fixing frame, the front edge is located on the press plate, and the two side edges are parallel to the two second side walls.

In an embodiment of the present invention, one end, away from the press plate, of each of the two second side walls is provided with a guide groove, the shielding cover further has first bent portions formed on the side edges and adjacent to the back edge, each of the first bent portions is provided with a guide rod, and the guide rod is arranged in the guide groove in a penetration manner and is suitable to slide and rotate in the guide groove, such that the shielding cover is suitable to be opened or closed relative to the fixing frame.

In an embodiment of the present invention, the shielding cover further has second bent portions formed on the side edges and adjacent to the front edge, and when the shielding cover is closed relative to the fixing frame, the second bent portions are attached to the second side walls.

In an embodiment of the present invention, the shielding cover further has second bent portions formed on the side edges and adjacent to the front edge, each of the second bent portions is provided with a clamping hole, each of the two second side walls is provided with a bump adjacent to the press plate, and when the shielding cover is closed relative to the fixing frame, the bump is suitable to be clamped with the clamping hole.

In an embodiment of the present invention, the shielding cover further has second bent portions formed on the side edges and adjacent to the front edge, an inner side of each of the second bent portions is provided with a bump, each of the second side walls is provided with a clamping hole adjacent to the press plate, and when the shielding cover is closed relative to the fixing frame, the bump is suitable to be clamped with the clamping hole.

In an embodiment of the present invention, the fixing frame further includes a stepped structure connecting the press plate to the one of the first side walls or a second one of the two first side walls, and the stepped structure is not connected to the second side walls.

In an embodiment of the present invention, the fixing frame is integrally formed.

The electronic device provided by the present invention includes a mainboard, a shielding device, a connector, an electronic module, and a housing baseboard. The shielding device includes a fixing frame and a shielding cover. The fixing frame is fixedly arranged on the mainboard and provided in a framing manner with an accommodating space. The fixing frame includes two first side walls opposite to each other, two second side walls opposite to each other, and a press plate. The press plate is connected to one of the two first side walls. The shielding cover is pivotally connected to one side, away from the press plate, of the fixing frame and is suitable to be opened or closed relative to the fixing frame. The connector is arranged on the mainboard and located in the accommodating space. The electronic module is arranged in the accommodating space and is suitable to be electrically connected to the connector. Opening of the shielding cover is suitable to expose the electronic module, and closing of the shielding cover is suitable to shield the electronic module. The housing baseboard covers part of the mainboard and part of the press plate, and has an open groove through which at least the shielding cover is exposed.

In an embodiment of the present invention, the connector is covered by the press plate.

In an embodiment of the present invention, the electronic module is a double data rate synchronous dynamic random access memory.

The shielding device according to the present invention includes the shielding cover and the fixing frame designed in a two-piece manner. The fixing frame is fixedly arranged on the mainboard of the electronic device and partially covered by the housing baseboard. The shielding cover is pivotally connected to one side of the fixing frame and may be opened or closed relative to the fixing frame to expose or shield the electronic module framed by the fixing frame. Because the shielding cover may be freely opened or closed relative to the fixing frame, it is convenient for a user to disassemble the electronic module.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
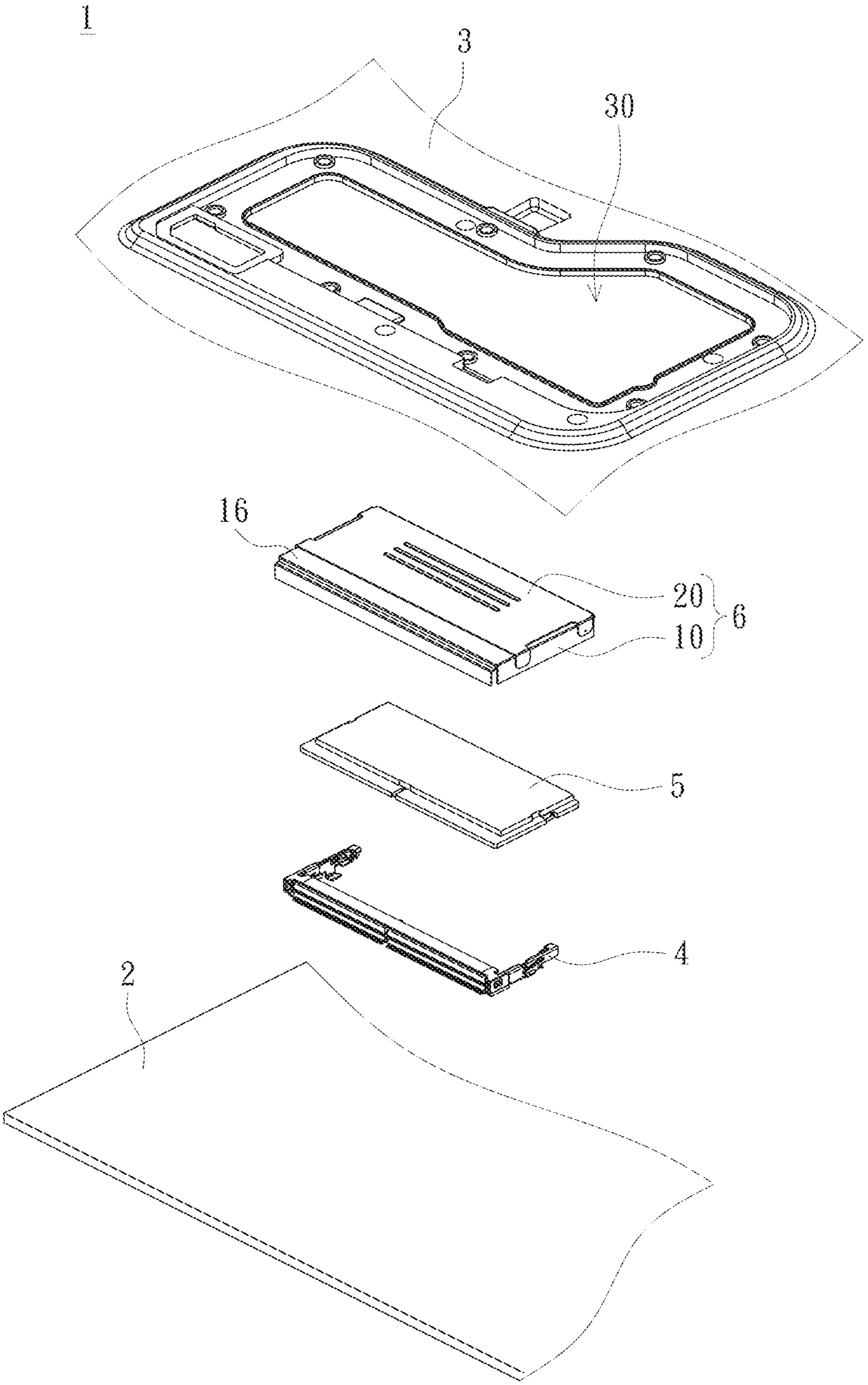
FIG. 1 is a schematic partial exploded view of an electronic device according to an embodiment of the present invention.
Figure 2:
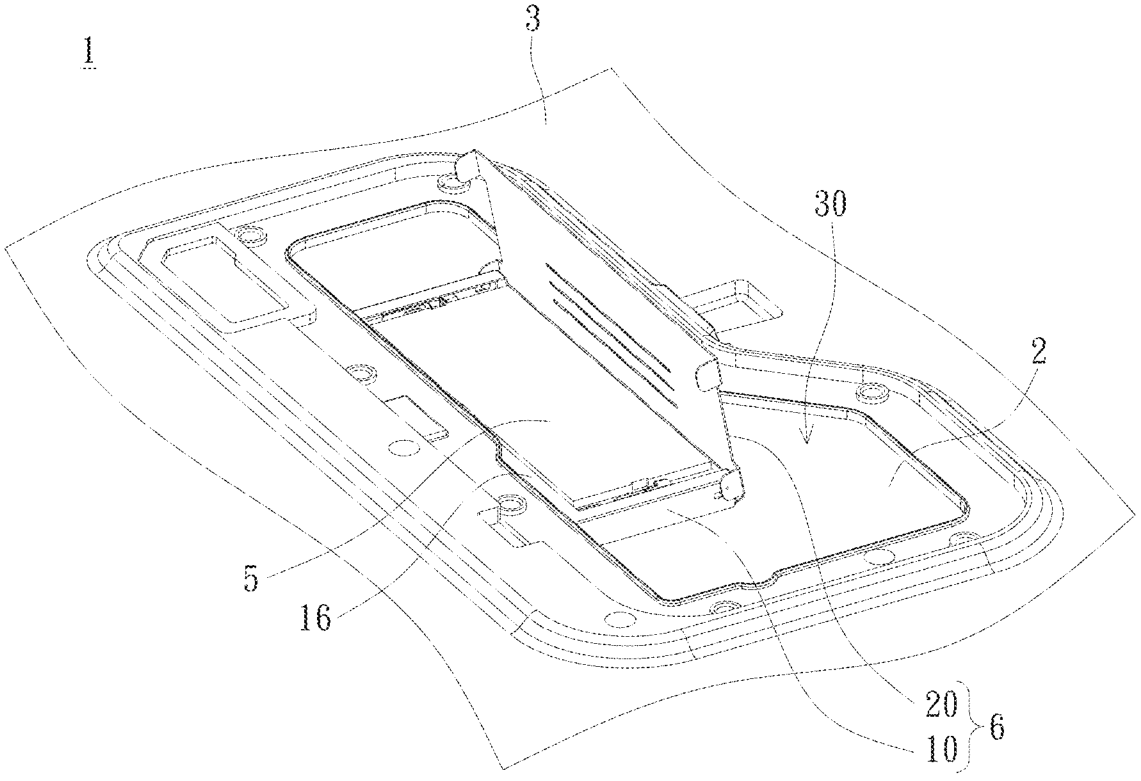
FIG. 2 is a schematic diagram of a partial structure of an electronic device according to an embodiment of the present invention.

FIG. 1 is a schematic partial exploded view of an electronic device according to an embodiment of the present invention. FIG. 2 is a schematic diagram of a partial structure of an electronic device according to an embodiment of the present invention. As shown in FIG. 1 and FIG. 2, an electronic device 1 includes a mainboard 2, a connector 4, an electronic module 5, a shielding device 6, and a housing baseboard 3. The connector 4 is arranged on the mainboard 2. The electronic module 5 is arranged on the mainboard 2 and electrically connected to the connector 4. The shielding device 6 includes a fixing frame 10 and a shielding cover 20. The fixing frame 10 is fixedly arranged on the mainboard 2 and is provided in a framing manner with an accommodating space S (marked in subsequent FIG. 3). The accommodating space S is suitable for accommodating the connector 4 and the electronic module 5. In an embodiment, the fixing frame 10 includes a press plate 16, and the connector 4 is covered by the press plate 16. The shielding cover 20 is pivotally connected to one side, away from the press plate 16, of the fixing frame 10 and is suitable to be opened or closed relative to the fixing frame 10. The housing baseboard 3 covers part of the mainboard 2 and part of the press plate 16, and the housing baseboard 3 has an open groove 30 through which the shielding cover 20 is exposed.

Figure 3:
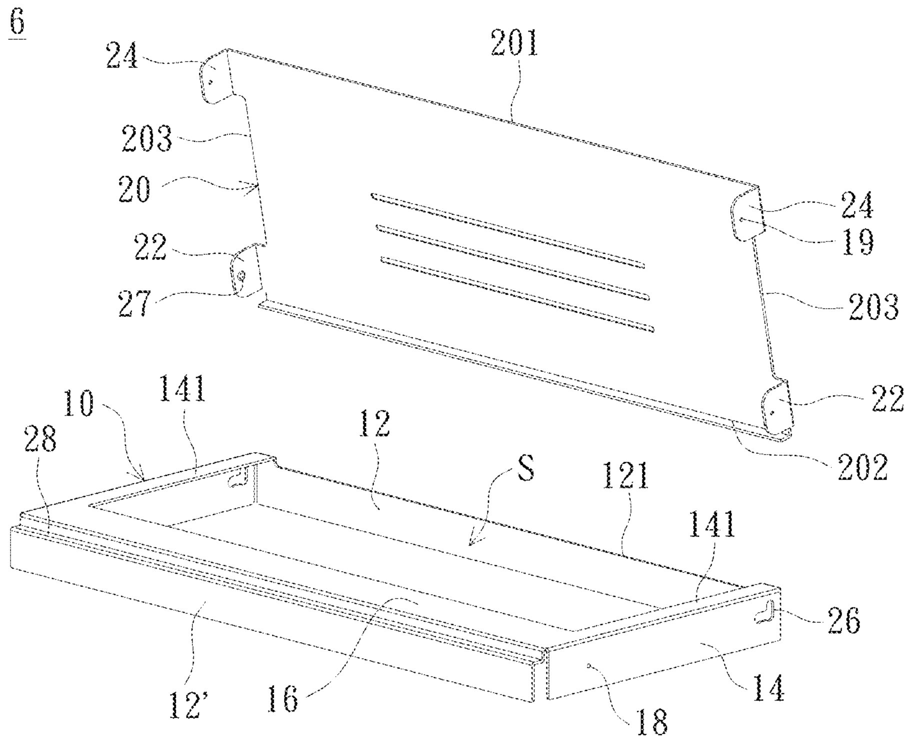
FIG. 3 is a schematic exploded view of a shielding device according to an embodiment of the present invention.

Continuing with the above description, FIG. 3 is a schematic exploded view of a shielding device according to an embodiment of the present invention. As shown in FIG. 3, the fixing frame 10 of the shielding device 6 includes two first side walls 12 and 12' opposite to each other, two second side walls 14 opposite to each other, and the press plate 16. The fixing frame 10 is provided in a framing manner with the accommodating space S, and the press plate 16 is connected to the first side wall 12'. The shielding cover 20 of the shielding device 6 is pivotally connected to one side, away from the press plate 16, of the fixing frame 10 and is suitable to be opened or closed relative to the fixing frame 10. In an embodiment, the fixing frame 10 further includes a stepped structure 28 connecting the press plate 16 to the first side wall 12', and the stepped structure 28 is not connected to the second side walls 14.

Figure 4:
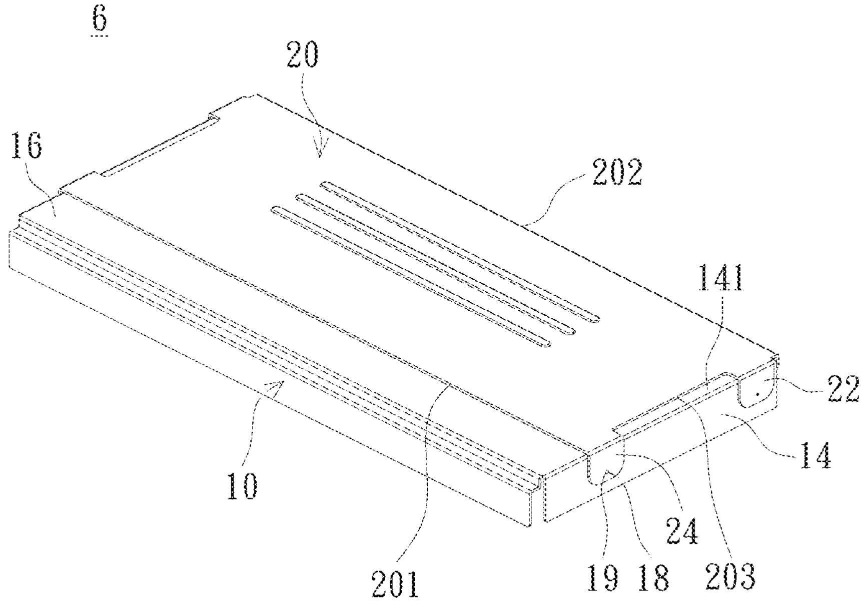
FIG. 4 is a schematic diagram of a shielding device in a cover closing state according to an embodiment of the present invention.

FIG. 4 is a schematic diagram of a shielding device in a cover closing state according to an embodiment of the present invention. Specifically, as shown in FIG. 3 and FIG. 4, in an embodiment, the first side wall 12 of the fixing frame 10 that is not connected to the press plate 16 has a first surface 121, each of the two second side walls 14 of the fixing frame 10 has a second surface 141, and a guide groove 26 is formed in one end, away from the press plate 16, of each of the two second side walls 14. The shielding cover 20 has a front edge 201, a back edge 202 opposite to each other, and two side edges 203 opposite to each other. The shielding cover 20 is provided in an extension manner with first bent portions 22 respectively located on the two side edges 203 and adjacent to the back edge 202. Each of opposite inner sides of the two first bent portions 22 is provided with a guide rod 27. The guide rod 27 may be arranged in the guide groove 26 in a penetration manner and is suitable to slide and rotate in the guide groove 26 so as to drive the shielding cover 20 to be opened or closed relative to the fixing frame 10. In an embodiment, the shielding cover 20 further has two second bent portions 24 respectively formed on the two side edges 203 and adjacent to the front edge 201. As shown in FIG. 4, when closed relative to the fixing frame 10, the shielding cover 20 covers the first surface 121 (marked in FIG. 3) and the second surface 141, the front edge 201 of the shielding cover 20 is located on the press plate 16, the side edges 203 are parallel to the second side walls 14, and the second bent portions 24 are attached to the second side walls 14.

In an embodiment, each of the second bent portions 24 is provided with a clamping hole 19, and one end, adjacent to the press plate 16, of each of the second side walls 14 is provided with a bump 18. When the shielding cover 20 is closed relative to the fixing frame 10, the bump 18 is suitable to be clamped with the clamping hole 19. The bump 18 and the clamping hole 19 may be arranged oppositely. In an embodiment not shown, each of opposite inner sides of the two second bent portions 24 is provided with a bump 18, and one end, adjacent to the press plate 16, of each of the second side walls 14 is provided with a clamping hole 19. When the shielding cover 20 is closed relative to the fixing frame 10, the bump 18 is suitable to be clamped with the clamping hole 19.

Figure 5:
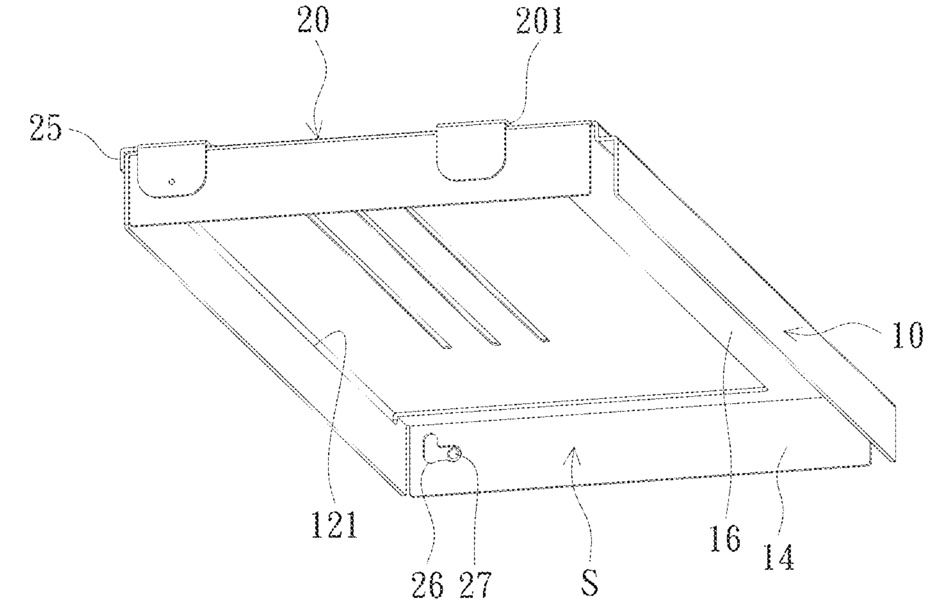
FIG. 5, FIG. 6, and FIG. 7 are schematic sectional views of a shielding device in a cover opening process according to an embodiment of the present invention.
Figure 6:
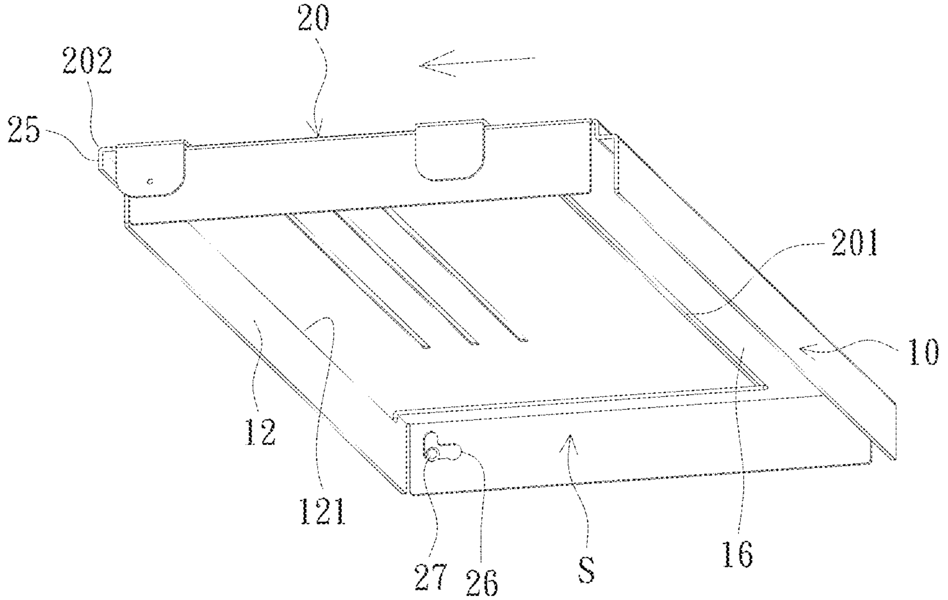
Figure 7:
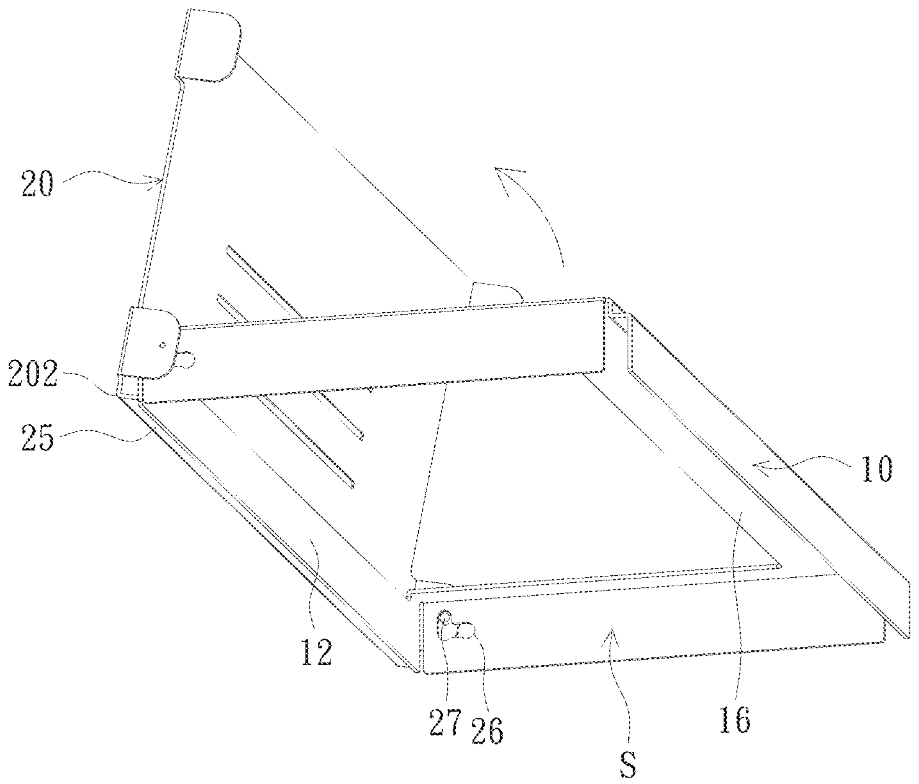

FIG. 5, FIG. 6, and FIG. 7 are schematic sectional views of a shielding device according to an embodiment of the present invention during cover opening. As shown in FIG. 5, the guide groove 26 is, for example, L-shaped. When the shielding cover 20 covers the fixing frame 10, the guide rod 27 is located at one end, adjacent to the press plate 16, of the guide groove 26, and the shielding cover 20 will cover part of the press plate 16. When the shielding cover 20 is about to be opened, as shown in FIG. 6, the shielding cover 20 is first moved away from the press plate 16, and the guide rod 27 is driven to move away from the press plate 16 to a turning point of the guide groove 26, thus making the shielding cover 20 keep away from the press plate 16. In this case, there is a gap between the front edge 201 of the shielding cover 20 and the press plate 16 to facilitate opening the shielding cover 20. In an embodiment, the first surface 121 of the first side wall 12 may be slightly lower than a height of the second surface 141 (marked in FIG. 3 and FIG. 4), such that during the process of moving the shielding cover 20 away from the press plate 16, the shielding cover 20 will not rub against the first surface 121, thereby avoiding the shielding effect of the shielding device 6 being reduced due to wear of the first surface 121. As shown in FIG. 7, when the shielding cover 20 is opened relative to the fixing frame 10, the guide rod 27 rotates in the guide groove 26 and moves towards the second surface 141 in accordance with a shape of the guide groove 26, making the shielding cover 20 smoothly expose the accommodating space S.

In an embodiment, the shielding cover 20 further has a third bent portion 25 arranged on the back edge 202 of the shielding cover 20. As shown in FIG. 6, when the shielding cover 20 moves away from the press plate 16, the third bent portion 25 is located in a spaced manner on an outer side of the first side wall 12. As shown in FIG. 7, when the shielding cover 20 is opened relative to the fixing frame 10, the third bent portion 25 may abut against the outer side of the first side wall 12. In an embodiment, the fixing frame 10 is integrally formed.

In an embodiment, the electronic device 1 is, for example, a laptop, a tablet, or a display, the mainboard 2 is, for example, a motherboard or a circuit board of the electronic device 1, and the electronic module 5 is, for example, a double data rate synchronous dynamic random access memory. However, the present invention is not limited thereto.

According to the above, the shielding device 6 provided by an embodiment of the present invention includes the shielding cover 20 and the fixing frame 10 designed in a two-piece manner. The fixing frame 10 is fixedly arranged on the mainboard 2 of the electronic device 1 and partially covered by the housing baseboard 3. The shielding cover 20 is pivotally connected to one side of the fixing frame 10 and may be opened or closed relative to the fixing frame 10 to expose or shield the electronic module 5 framed by the fixing frame 10. Due to a two-piece structure of the shielding cover 20 and the fixing frame 10, when the shielding device 6 is covered by the housing baseboard 3, only part of the fixing frame 10 is covered/pressed, and the opening and closing of the shielding cover 20 are not limited by the housing baseboard 3, such that the shielding cover 20 may be freely opened or closed relative to the fixing frame 10, thereby facilitating a user disassembling the electronic module 5. This solves the problem of inconvenience caused by the shielding cover 20 currently used on the market being covered by the housing baseboard 3 of the electronic device 1 due to spatial limitations of a machine type after covering the electronic module 5, such that when the user needs to replace the electronic module 5, the housing baseboard 3 and the shielding cover 20 must be removed before the electronic module 5 is disassembled.

Further, when the user opens the shielding cover 20, the shielding cover 20 is easier to open by the user with a slidable and rotatable pivot structure formed by the guide rods 27 of the shielding cover 20 and the guide grooves 26 of the fixing frame 10. When the user closes the shielding cover 20, the shielding cover 20 may be really clamped and not prone to sliding with the mutually corresponding bumps 18 and clamping holes 19 arranged on the shielding cover 20 and the fixing frame 10. Furthermore, the shielding cover 20 and the fixing frame 10 are pivotally connected to each other, which may better avoid that the user forgetting to close the shielding cover 20 after replacing the electronic module 5 by himself and affecting the shielding effect.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shielding device configured for applying in an electronic module arranged on a mainboard of an electronic device having a housing baseboard, the mainboard being provided with a connector configured to be electrically connected to the electronic module, the shielding device comprising:

a fixing frame fixedly arranged on the mainboard and provided in a framing manner with an accommodating space configured for accommodating the connector and the electronic module, wherein the fixing frame comprises two first side walls opposite to each other, two second side walls opposite to each other, and a press plate, the press plate is connected to one of the two first side walls and covers the connector, and a part of the press plate is covered by the housing baseboard; and a shielding cover pivotally connected to one side, away from the press plate, of the fixing frame and configured to be opened or closed relative to the fixing frame, wherein opening of the shielding cover is configured to expose the electronic module, and closing of the shielding cover is configured to shield the electronic module.

2. The shielding device according to claim 1, wherein a second one of the two first side walls not connected to the press plate has a first surface, each of the two second side walls has a second surface, and when the shielding cover is closed relative to the fixing frame, the first surface and the second surface are covered by the shielding cover.

3. The shielding device according to claim 1, wherein the shielding cover has a front edge and a back edge opposite to each other, and two side edges opposite to each other, and when the shielding cover is closed relative to the fixing frame, the front edge is located on the press plate, and the two side edges are parallel to the two second side walls.

4. The shielding device according to claim 3, wherein one end, away from the press plate, of each of the two second side walls is provided with a guide groove, the shielding cover further has two first bent portions respectively formed on the two side edges and adjacent to the back edge, each of the two first bent portions is provided with a guide rod, and the guide rod is arranged in the guide groove in a penetration manner and is configured to slide and rotate in the guide groove, such that the shielding cover is configured to be opened or closed relative to the fixing frame.

5. The shielding device according to claim 3, wherein the shielding cover further has two second bent portions respectively formed on the two side edges and adjacent to the front edge, and when the shielding cover is closed relative to the fixing frame, the two second bent portions are attached to the two second side walls, respectively.

6. The shielding device according to claim 3, wherein the shielding cover further has two second bent portions respectively formed on the two side edges and adjacent to the front edge, each of the two second bent portions is provided with a clamping hole, each of the two second side walls is provided with a bump adjacent to the press plate, and when the shielding cover is closed relative to the fixing frame, the bump is configured to be clamped with the clamping hole.

7. The shielding device according to claim 3, wherein the shielding cover further has two second bent portions respectively formed on the two side edges and adjacent to the front edge, an inner side of each of the two second bent portions is provided with a bump, each of the two second side walls is provided with a clamping hole adjacent to the press plate, and when the shielding cover is closed relative to the fixing frame, the bump is configured to be clamped with the clamping hole.

8. The shielding device according to claim 1, wherein the fixing frame further comprises a stepped structure connecting the press plate to the one of the two first side walls or a second one of the two first side walls, and the stepped structure is not connected to the two second side walls.

9. The shielding device according to claim 1, wherein the fixing frame is integrally formed.

10. An electronic device, comprising:

a mainboard;

a shielding device comprising:

a fixing frame fixedly arranged on the mainboard and provided in a framing manner with an accommodating space, wherein the fixing frame comprises two first side walls opposite to each other, two second side walls opposite to each other, and a press plate, and the press plate is connected to one of the two first side walls; and a shielding cover pivotally connected to one side, away from the press plate, of the fixing frame and configured to be opened or closed relative to the fixing frame;

a connector arranged on the mainboard and located in the accommodating space;

an electronic module arranged in the accommodating space and configured to be electrically connected to the connector, wherein opening of the shielding cover is configured to expose the electronic module, and closing of the shielding cover is configured to shield the electronic module; and a housing baseboard covering part of the mainboard and part of the press plate, wherein the housing baseboard has an open groove through which at least the shielding cover is exposed.

11. The electronic device according to claim 10, wherein the connector is covered by the press plate.

12. The electronic device according to claim 10, wherein the electronic module is a double data rate synchronous dynamic random access memory.

* * * * *